(12) United States Patent
Gao

(10) Patent No.: US 11,445,639 B2
(45) Date of Patent: Sep. 13, 2022

(54) INFORMATION TECHNOLOGY (IT) COOLING SYSTEM WITH FLUID DISTRIBUTION CONFIGURATION

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/104,896

(22) Filed: Nov. 25, 2020

(65) Prior Publication Data

US 2022/0095491 A1 Mar. 24, 2022

Related U.S. Application Data

(60) Provisional application No. 63/082,683, filed on Sep. 24, 2020.

(51) Int. Cl.
*H05K 7/20* (2006.01)

(52) U.S. Cl.
CPC ..... *H05K 7/20763* (2013.01); *H05K 7/20272* (2013.01); *H05K 7/20281* (2013.01); *H05K 7/20836* (2013.01)

(58) Field of Classification Search
None
See application file for complete search history.

(56) References Cited

U.S. PATENT DOCUMENTS

| 10,225,957 B2 * | 3/2019 | Gao ................... H05K 7/20172 |
| 10,342,164 B2 * | 7/2019 | So ...................... H05K 7/20772 |
| 10,888,029 B2 * | 1/2021 | Jochim ............. H05K 7/20736 |
| 2011/0154842 A1 * | 6/2011 | Heydari ............ H05K 7/20836 |
| | | 62/259.2 |
| 2020/0404812 A1 * | 12/2020 | Gao ................... H05K 7/20254 |
| 2021/0360821 A1 * | 11/2021 | Gao ...................... H05K 7/1497 |
| 2021/0368656 A1 * | 11/2021 | Heydari ............. G05B 19/4155 |

\* cited by examiner

*Primary Examiner* — Courtney L Smith
(74) *Attorney, Agent, or Firm* — Womble Bond Dickinson (US) LLP

(57) ABSTRACT

Embodiments are disclosed of an apparatus multiple information technology (IT) units arranged into an IT cluster. Each IT unit includes an IT container paired with a corresponding cooler. The IT cluster includes first and second rows, each row having an upstream end and a downstream end and including one or more IT units positioned adjacent to and abutting each other. The cooler of each IT unit in each row is either fluidly coupled by an intra-row fluid connection to the IT container of the next downstream IT unit in the same row or is fluidly coupled by an inter-row fluid connection to the IT container of an IT unit in the second row. The cluster includes at least one pair of inter-row fluid connections, so that the pair of inter-row fluid connections, the intra-row fluid connections in the first row, and the intra-row fluid connections in the second row, form at least one fluid loop within the IT cluster. The internal and external loop are arranged in different modular designs.

20 Claims, 14 Drawing Sheets

INFORMATION TECHNOLOGY (IT) COOLING SYSTEM WITH FLUID DISTRIBUTION CONFIGURATION

CROSS-REFERENCE TO RELATED APPLICATIONS

This application claims priority under 35 U.S.C. § 119(e) to U.S. Provisional Application No. 63/082,683, filed 24 Sep. 2020. The entire content of the priority application is hereby incorporated by reference.

TECHNICAL FIELD

The disclosed embodiments relate generally to liquid cooling systems for temperature control of electronic equipment and in particular, but not exclusively, to a cooling system with a fluid distribution configuration.

BACKGROUND

Much modern information technology (IT) equipment such as servers, blade servers, routers, edge servers, etc., generates a substantial amount of heat during operation. The heat generated by individual components, especially high-power components such as processors, SoC which includes multiple chiplets, makes many of these individual components impossible or difficult to cool effectively with air cooling systems. Modern IT equipment therefore requires liquid cooling or liquid-air hybrid cooling.

As a result of the requirement for liquid cooling, some pieces of IT equipment have an on-board liquid cooling system that is thermally coupled to individual components that need cooling. But these on-board liquid cooling systems usually do not operate in isolation. They are usually coupled to at least one larger cooling system, such as liquid cooling system in an electronics rack, and the rack's cooling system can further be coupled to the liquid cooling system of a larger facility such as a data center. In such a system, the data center's cooling system circulates a working fluid through the rack cooling system, which in turn circulates the working fluid through the cooling system on the piece of IT equipment.

Previous solutions have designed the IT rack/container and facility cooling infrastructure separately, which means the cooling infrastructure and coolant loop connections are facility-side infrastructure. This design has long been used and adapted by the industry, but it is inflexible and lacks the resilience needed for modern IT infrastructure, especially the ever-changing IT configurations. Several existing solutions have proposed integrating cooling equipment with the rack, but each individual rack-level cooling system is still separate, which means facility-level distribution and cooling infrastructure is still needed. The resulting hardware and control system are complex and the cost is high.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3A is a plan view, FIG. 3B a side view.

DETAILED DESCRIPTION

Figure 1:
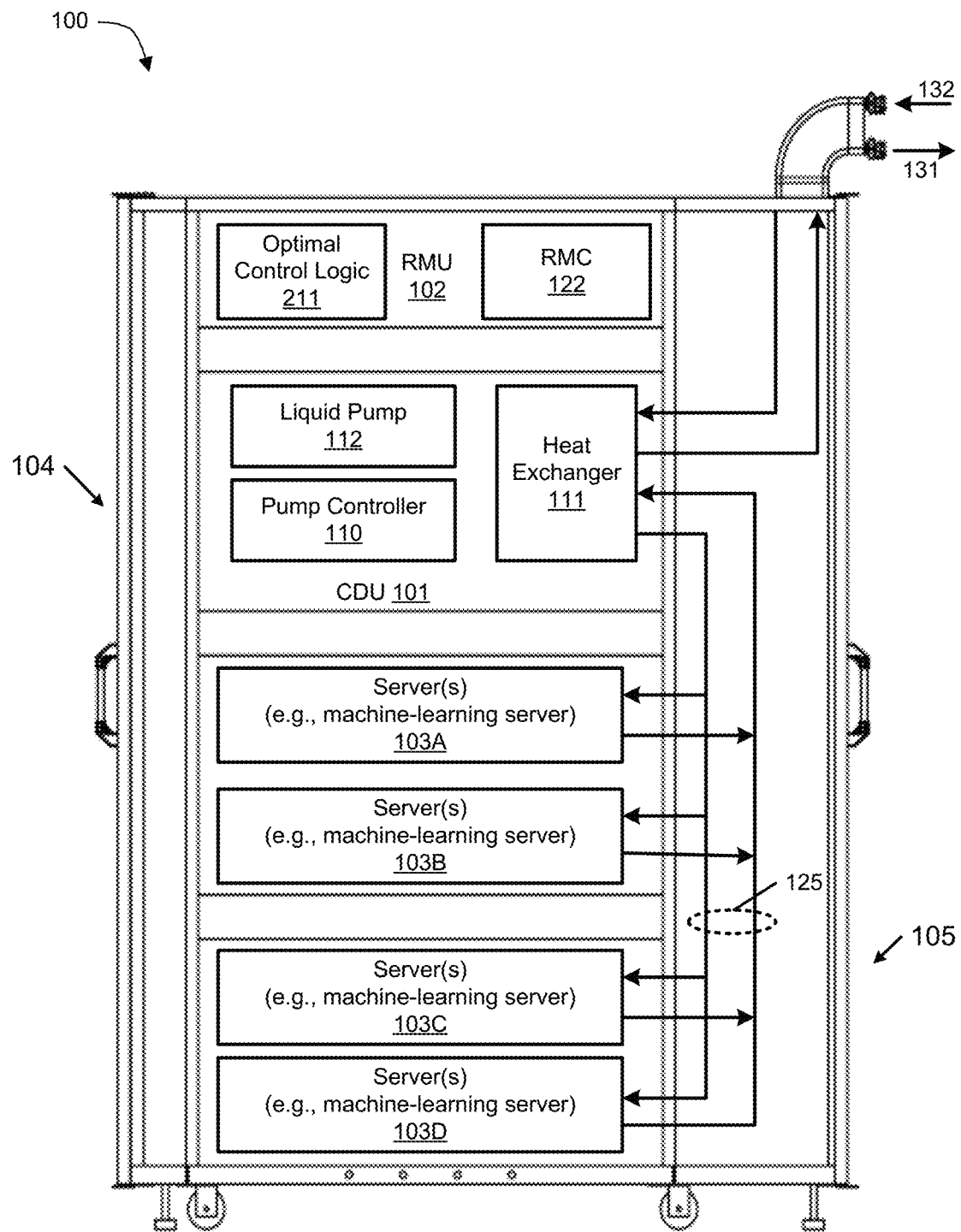
FIG. 1 is a block diagram of an embodiment of an IT container including an electronic rack with electronics and cooling systems housed within.

Embodiments are described of a multi-loop cooling configuration for high-density server racks. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require any particular orientation of the described embodiments when in actual use.

Modular design has becoming more and more important and popular especially for many application scenarios. There are different methods for designing an IT cluster using modular concepts. The modular concept is no longer a concept for an IT container, it can be used for any part of the system or sectors of a cluster. It is becoming evenly important to develop modular cooling and power modules, as well as combined module of IT module to enable higher system flexibility and resilience. Especially, a modular liquid cooling architecture is needed for supporting an IT cluster or IT container which is populated with liquid cooled IT equipment or liquid cooling units among the IT. The described embodiments provide designs that can configure different type of liquid cooling distribution cluster for different scenarios. It is paramount important for the increasing power density generated within the IT racks.

Embodiments are described of an IT Infrastructure design with a novel cooling loop management configuration. The described embodiments are used for designing and developing modular compute and storage clusters, either for a hyperscale a data center building or in a container data center system. The embodiments focus primarily on the system architecture for implementing IT racks and cooling hardware as well as corresponding solutions, especially heat transfer system and fluid management designs to extract heat load from each IT racks to external to the clusters. The embodiments include a cooling unit integrated with an IT container, forming part of fluid transferring loop. Multiple such parts are then combined to result in different types of internal recirculation loops. Each internal recirculation loop is formed within an IT cluster. The cooling unit is connected to the external loop to delivering cooling capacity to the cluster internal loop. The internal loops are configured differently based on system layout, module layout, and IT layout. In addition, the internal loop can be dynamically adjusted, before and after the entire cluster is deployed, allowing different recirculation of coolant among IT clusters. In addition, the modular configuration schemes are proposed for external and internal layouts and applications. The flow rate, pressure and temperature are controlled based on IT requirements.

The simplified system design can have multiple benefits, one of which is fast deployment. The disclosed embodiments integrate the complex fluid system and management with an IT enclosure instead of designing a separate system as facility infrastructure. With such a design, deployment is simplified and the configurations and thermal system arrangements can be dynamically adjusted. The hardware and system configurations may need to adjusted based on different use cases and application scenarios. Especially in cloud computing, the system configuration may need to adjusted based on customer requirements. Therefore, infrastructure resilience not only requires it able to support different type of hardware deployment and operating including the power and cooling requirements, but also the entire system level PoD/cluster arrangement, and system reconfigurations.

It has been mentioned that modular design is important, the method for designing and deploying the modules is paramount important. The disclosed embodiments aim to provide effect modular designs and methods.

The disclosed embodiments provide flexible configurations for IT racks, cooling hardware, and fluid management, at the same time eliminating major facility level cooling infrastructure for internal fluid distribution. This highly simplifies the facility-level design for designing heat transfer loops. The design and operation method enable high flexibilities and resilience for: system loop configurations and fluid management; rack cluster grouping; and modular design methods and system partition layout. Another proposed feature is that the internal loop within a cluster is completely disaggregated and independent from the facility, instead being formed by the IT containers and their corresponding cooling units. In addition, the internal loop scheme can be dynamically reconfigured based on need. The design can be easily adapted by modular design. In addition, the current design provides robust system redundancy to handle different failure scenarios or other abnormal scenarios, and another innovation is that the room facility-side design is simplified for forming different heat transfer loops in a cooling system.

FIG. 1 is a block diagram illustrating a side view of an embodiment of an electronics rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

Figure 2:
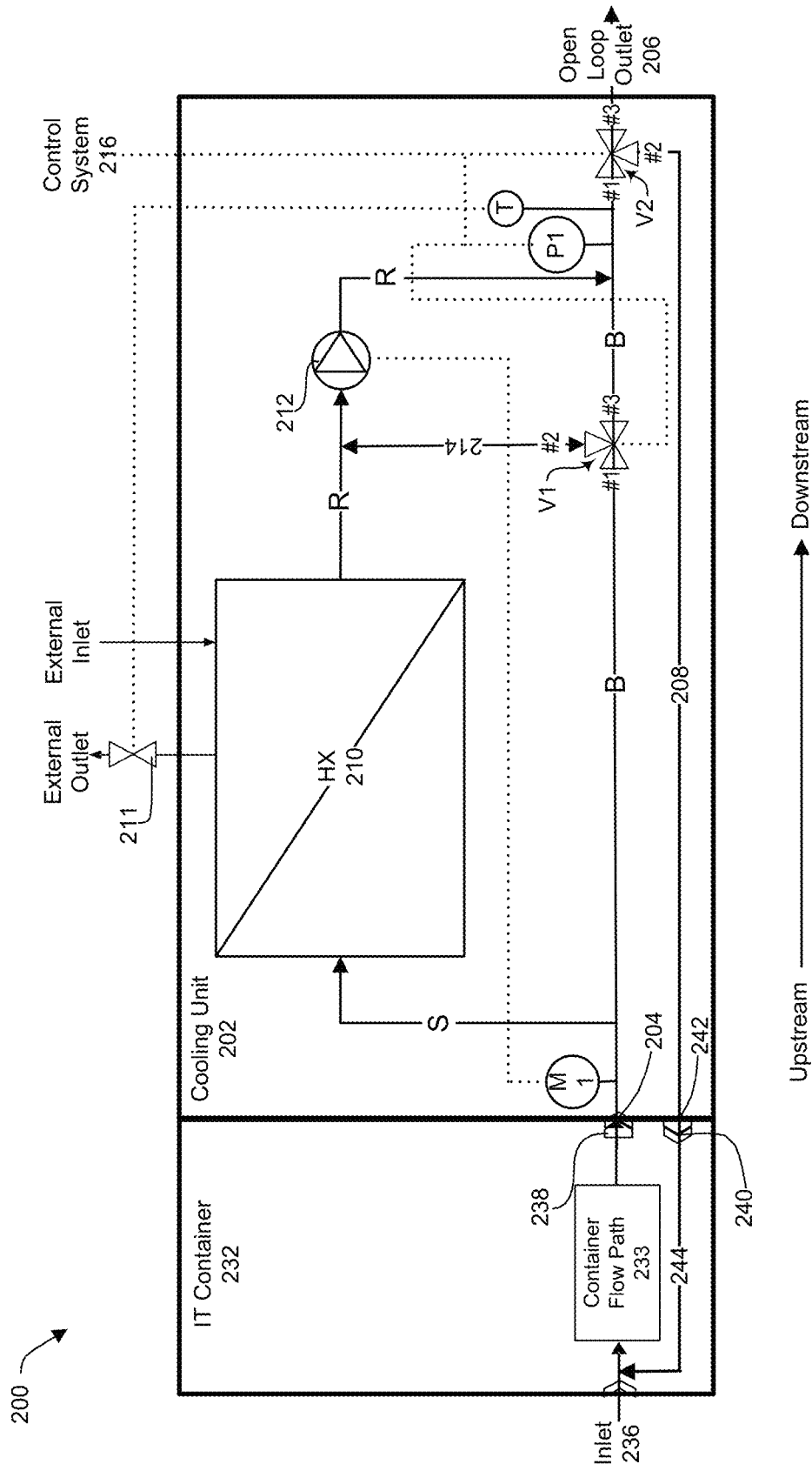
FIG. 2 is a block diagram of an embodiment of an IT unit including an IT container and its corresponding cooler or cooling unit.
Figure 3A:
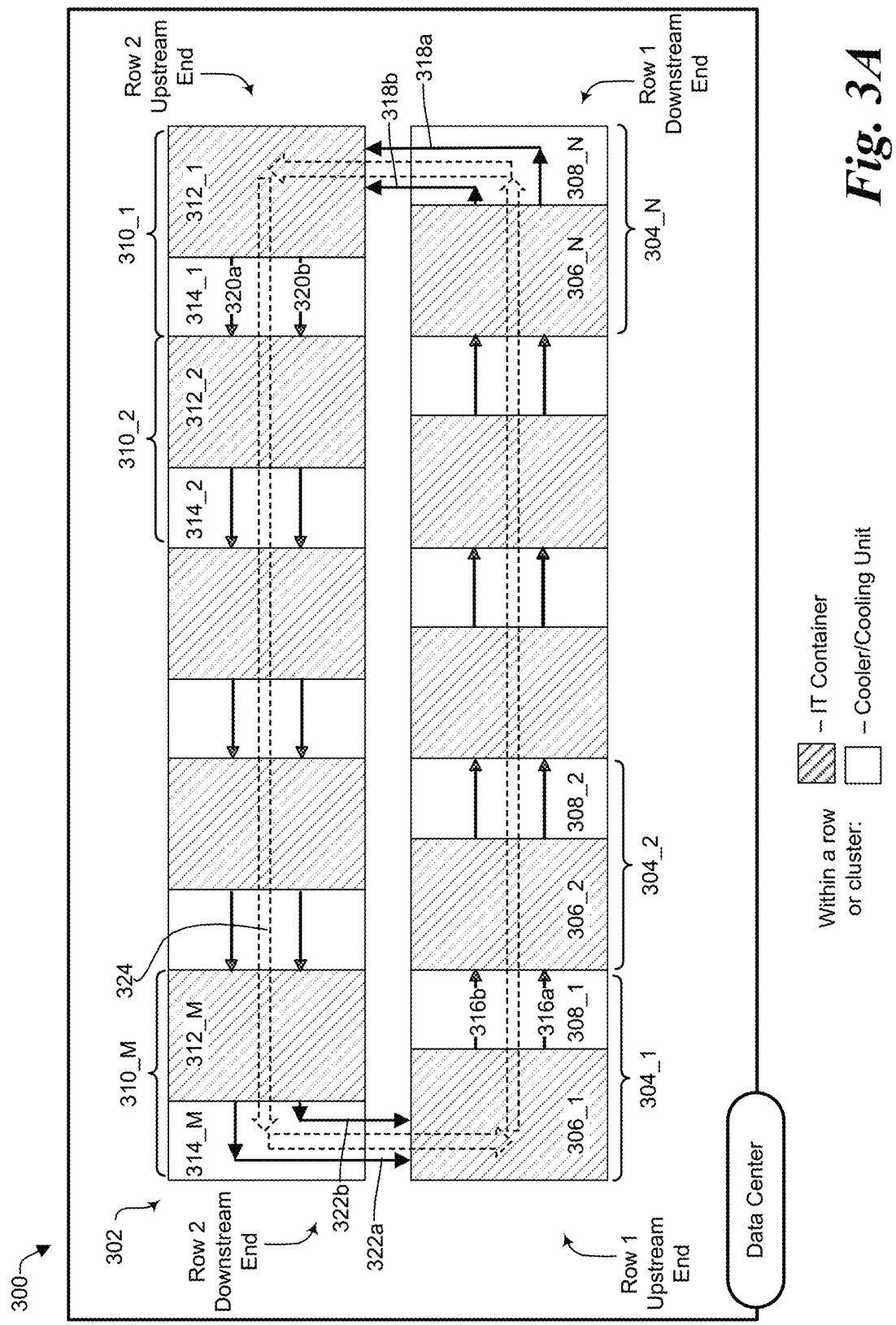
FIGS. 3A-3B are drawings of an embodiment of a cooling system.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT container that can be coupled with a cooling unit as shown in FIG. 2, to form an IT unit that can then be grouped with other IT units into a cluster as shown in FIG. 3A et seq.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

FIG. 2 illustrates an embodiment of an IT unit 200 that includes a cooler or cooling unit 202 fluidly coupled to an information technology (IT) container 232 to cool the components within the IT container. IT container 232, as its name suggests, contains heat-generating IT components and includes a container flow path 233 by which cooling fluid entering IT container 232 is delivered to the heat-generating components within. The container flow path 233 can be understood as the cooling fluid management design for the IT container. FIG. 1 illustrates an embodiment of a container flow path 233 in a data center rack, but other embodiments of IT container 232 can have container flow paths different than shown. Cooling unit 202 is not limited to any particular container flow path, but can instead be used with any flow path within IT container 232. IT container 232 also includes an inlet 236 and an outlet 238, and container flow path 233 is fluidly coupled by fluid lines to both inlet 236 and outlet 238. IT container 232 also includes a further closed-loop container inlet 240 that is fluidly coupled by a closed-loop flow path 244 between closed-loop container inlet 240 and a position upstream of container flow path 233, between container inlet 236 and the inlet of the container flow path. Cooling unit 202 similarly includes on inlet 204 coupled to bypass line B and includes an outlet 242 fluidly coupled to closed-loop outlet 208. The fluid lines within IT container 232 can be made of rigid tubing, flexible tubing, or both, and can be pre-installed within the IT container to make it more modular.

IT container 232 is positioned upstream of cooling unit 202, with its container outlet 238 fluidly coupled to unit inlet 204 and its closed-loop container inlet 240 fluidly coupled to outlet 242 if it will be used in a closed-loop mode. In one embodiment, fluid coupling at container inlet 236, between container outlet 238 and unit inlet 204, and between outlet 242 and closed-loop container inlet 240 can be accomplished using quick-disconnect fittings or blind-mating fittings, but other embodiments can of course use different fluid couplings.

Cooler or cooling unit 202 is fluidly coupled with its corresponding upstream IT container 232, and can be further fluidly coupled with downstream IT containers (not shown in this figure, but see, e.g., FIGS. 3A-3B) to cool electronics within both the upstream and downstream IT containers. Cooling unit 202 includes a unit inlet 204 and two cooling outlets: an open-loop outlet 206 and a closed-loop outlet 208. Within cooling unit 202, a bypass line B fluidly connects inlet 204 to a second three-way valve V2. Valve V2 in turn fluidly couples bypass line B to open-loop outlet 206 and closed-loop outlet 208, so that valve V2 can be used to switch between open loop and closed-loop configurations. A first three-way valve V1 is also fluidly coupled into bypass line B between inlet 204 and valve V2. Three-way valves V1 and V2 both have three fluid ports, numbered #1-#3 in the figure. In both three-way valves V1 and V2, fluid can be directed from any port to one or both of the other ports; when the three-way valve directs flow from one port into both other ports, the valve can also change the proportion of flow going into each output port. In addition, in each valve V1 and V2 fluid flow from each port to another port can be independently adjusted and controlled with minimal impact on the other port, and in one mode of operation all three ports in a valve can be closed.

Cooling unit 202 also includes a main loop or cooling loop fluidly coupled to bypass line B. The main loop includes a heat exchanger (HX) 210 with an inlet that is fluidly coupled to bypass line B at or near inlet 204 by a supply line S. A return line R fluidly couples an outlet of heat exchanger 210 to bypass line B between first valve V1 and second valve V2; with this arrangement supply line S, heat exchanger 210, return line R, and a part of bypass line B form the main cooling loop. A pump 212 is fluidly coupled into return line R to circulate cooling fluid through the main loop and at least part of the bypass line. In the illustrated embodiment, heat exchanger 210 also includes an external inlet and an external outlet. The external outlet can include a valve 211 to turn the external outlet on and off. Also, valve 211 can be used to adjust the flow rate. In another embodiment, a pump can be used for adjusting fluid flow rate. Both the external outlet and external inlet can be coupled to a data center cooling system to supply cooling fluid to heat exchanger 210, with the external inlet coupled to a facility supply and the external outlet coupled to a facility return. Other embodiments of cooling unit 202 can be entirely self-contained and need not use an external inlet or external outlet. Still other embodiments of cooling unit 202 can be self-contained in respect of liquid cooling but still use external cooling sources such as airflow through the cooling unit.

A two-way line 214 is fluidly coupled to three-way valve V1 and to return line R upstream of pump 212. Fluid can flow both ways through two-way line 214: from return line R to valve V1, or the other way from valve V1 to return line R, depending on the unit's mode of operation. Bypass line B, together with two-way line 214 and three-way valve V1, are designed to address abnormal operating modes, thereby increasing system robustness, serviceability, and flexibility. Two-way line 214, as well as bypass line B, supply line S, and return line R, can all be made of flexible tubing, rigid tubing, or some combination of rigid and flexible tubing.

In addition to the flow hardware described above, cooling unit 202 can include various sensors to monitor conditions within the unit. Cooling unit 202 includes a flow meter M1, a pressure sensor P1, and a temperature sensor T, although other embodiments can include additional or different sensors for measuring these or other quantities within the unit. In the illustrated embodiment, flow meter M1 is positioned near inlet 204, while pressure sensor P1 and temperature sensor T are positioned in bypass line B downstream of where return line R joins the bypass line—specifically, in this embodiment, between where return line R is fluidly coupled to bypass line B and three-way valve V2. In other embodiments, the sensors can be positioned differently (see, e.g., FIG. 3). The various sensors in unit 202 are communicatively coupled to a control system 216, and control system 216 is also communicatively coupled to the flow hardware within unit 202 that can be controlled during operation—in this embodiment, pump 212 and three-way valves V1 and V2. The dotted lines in the figure illustrate the signal connections among the sensors, the control system, and the flow hardware. Thus, in the illustrated embodiment control system 216 can change the speed of pump 212, and the positions of three-way valves V1 and V2, based on input from flow meter M1, pressure sensor P1, and temperature sensor T, and any additional or different sensors that might be present.

In operation, cooling unit 202 can operate in a closed-loop mode, an open-loop mode, or a hybrid closed-loop/open-loop mode, depending primarily on the setting of three-way valve V2. When valve V2 directs fluid from port #1 to port #2, it forms a closed loop for the IT enclosure; when the V2 directs fluid from port #1 to port #3, it forms an open loop connecting the unit to a larger recirculation system. Three-way valve V1 is used together with two-way line 214 mostly to regulate the internal operation of cooling unit 202.

Cooling fluid enters IT container 232 through inlet 236, for instance from another cooling unit positioned upstream (not shown). The cooling fluid flows through container flow path 233, where it absorbs heat from IT components and electronics, and the now-hot cooling fluid exits the IT container through outlet 238. As it exits outlet 238, the now-hot cooling fluid enters cooling unit 202 through inlet 204 and flows through supply line S into heat exchanger 210, where the fluid is cooled. After it exits the heat exchanger through return line R and pump 212 and bypass line B, the now-cool fluid flows to valve V2, which is set to direct the fluid through port #2 into closed-loop outlet 208. Closed-loop outlet 208 is fluidly coupled to cooling unit outlet 242, so that the now-cool fluid flows through the closed-loop outlet to unit outlet 242. The fluid flows to unit outlet 242 and is received into IT container 232 through inlet 240 and is then directed back into the container flow path 233. In this closed-loop mode, then, cooling unit 202 recirculates cooling fluid to cool the upstream IT container 232. The fluid line that connects inlet 240 and container flow path 233 can be assembled separately or considered as part of the container flow path 233. The function of this fluid line is similar to the function of closed-loop outlet 208: to complete a closed loop for the IT container and cooling unit.

Figure 3B:
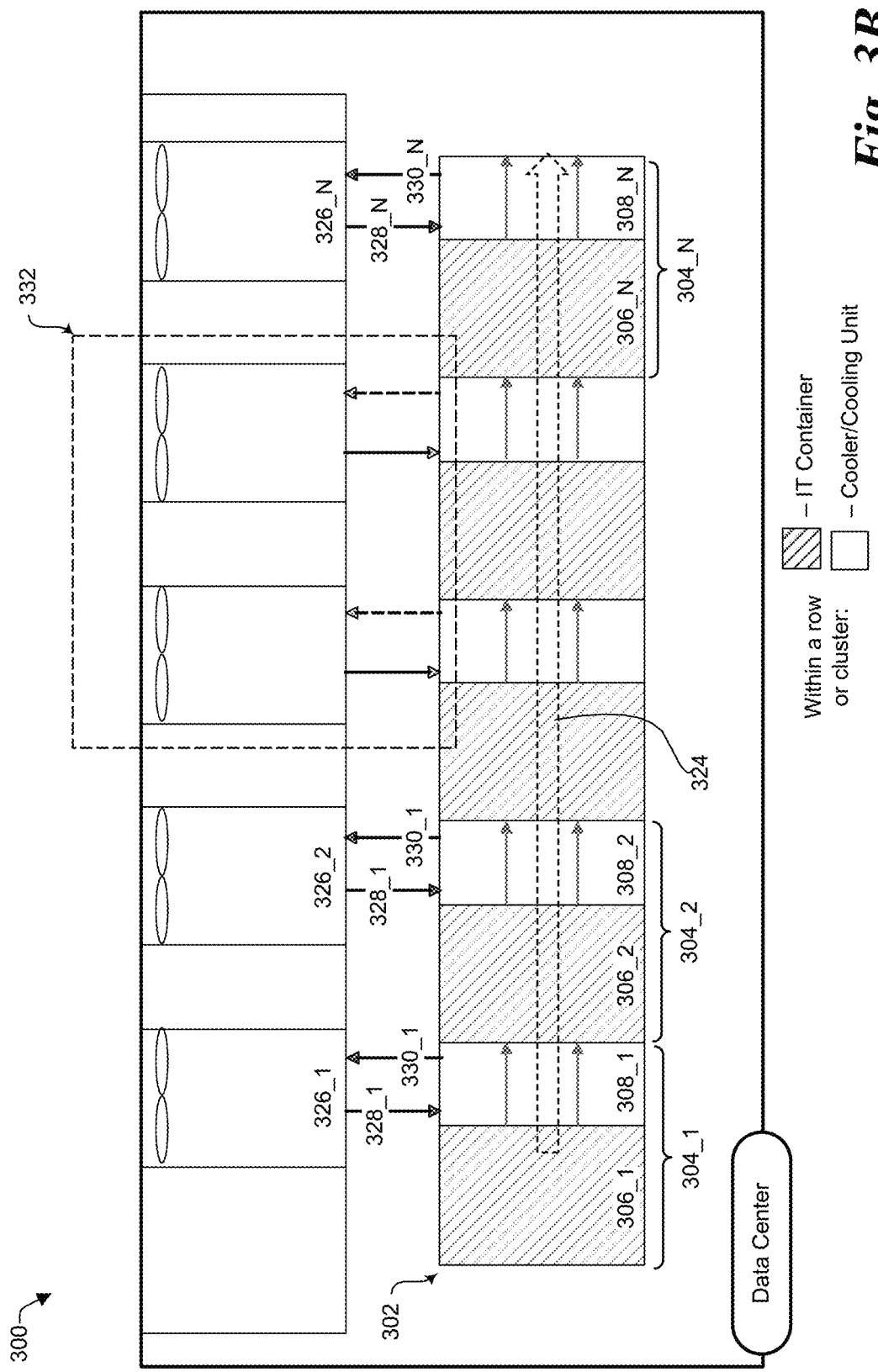

FIG. 3A-3B together illustrate an embodiment of a cooling system 300. FIG. 3A is a plan view, FIG. 3B a side view. Cooling system 300 includes at least one cluster 302 of IT units arranged in a first row (Row 1) and a second row (Row 2). In the illustrated embodiment the rows are positioned with the backs of the IT units facing each other, but in other embodiments the rows can be positioned differently relative to each other. Row 1 has an upstream end and a downstream end, and Row 2 similarly has an upstream end and a downstream end. In the illustrated embodiment the upstream end of row 1 is positioned next to the downstream end of row 2 and the downstream end of row 1 is positioned next to the upstream end of row 2, but in other embodiments the row arrangement can be different than shown.

Row 1 includes one or more IT units 304, and each IT unit includes an IT enclosure 306 and its corresponding cooler or cooling unit 308. Thus, the illustrated embodiment includes N IT units 304_1 through 304_N, including N IT containers 306_1 through 306_N each with its corresponding cooler 308_1 through 308_N, where N≥1. IT units 304 are arranged in series within the row, so that all the IT units have the same orientation, with each IT container 306 upstream of its corresponding cooler 308. As a result, row 1 has an IT container 306 at its upstream end, a cooler 308 at its downstream end, and alternates between IT containers and coolers. Row 2 includes one or more IT units 310, each of which includes an IT enclosure 312 and its corresponding cooler or cooling unit 314. Thus, the illustrated embodiment includes M IT units 310_1 through 310_M, including M IT containers 312_1 through 312_M, each with its corresponding cooler 314_1 through 314_M, where M≥1. IT units 304 are arranged in series within the row, with all the IT units in the same orientation, with each IT container 312 upstream of its corresponding cooler 314. As a result, row 2 has an IT container 312 at its upstream end and a cooler 314 at its downstream end. In the illustrated embodiment both rows 1 and 2 have the same number of IT units (i.e., M=N), but in other embodiments the rows need not have the same number of IT units (i.e., M≠N).

In addition to an upstream fluid connection to its corresponding IT container, each cooler in row 1 and row 2 has a downstream fluid connection to another IT container, for instance via its open-loop outlet (see FIG. 2). That downstream fluid connection can either be an intra-row fluid connection (i.e., a fluid connection to a downstream IT container in the same row) or an inter-row fluid connection (i.e., a fluid connection to an IT container in the other row). In row 1, then, fluid connections 316a and 316b are intra-row fluid connections that fluidly couple cooler 308_1 to downstream IT container 306_2, while fluid connections 318a and 318b are inter-row fluid connections that fluidly couple cooler 308_N to downstream IT container 312_1. Similarly, in row 2 fluid connections 320a and 320b are intra-row fluid connections that fluidly couple cooler 314_1 to IT container 312_2, while fluid connections 322a and 322b are inter-row fluid connections that fluidly couple cooler 314_M to IT container 306_1. Each of fluid connections 316, 318, 320, and 322 is shown in the drawing as a pair of connections (e.g., 316a and 316b) to illustrate the cooling and bypass flow paths through the coolers (see FIG. 2), but in practice both flow paths can be implemented with a single physical fluid connection. Each cluster 302 includes at least one pair of inter-row fluid connections, so that in each cluster the IT containers and their corresponding coolers, together with the intra-row fluid connections and the inter-row fluid connections, form at least one recirculation loop 324 within the cluster. Recirculation loop 324 circulates cooling fluid entirely within the cluster. Other embodiments of cluster 302 can include more than one pair of inter-row fluid connections, so that more than one recirculation loop can be formed within the cluster (see, e.g., FIG. 5B). No other facility is need for the internal loop.

As best seen in FIG. 3B, in addition to being fluidly coupled to their corresponding IT container and a downstream IT container, the heat exchanger 210 within each cooler (see FIG. 2)—and hence internal recirculation loop 324—can be fluidly coupled by an external fluid loop to one or more facility heat exchangers. In the illustrated embodiment, then, each cooler 308 is fluidly coupled to a corresponding facility heat exchanger 326 by a supply line 328 and a return line 330: cooler 308_1 is coupled to facility heat exchanger 326_1 by supply line 328_1 and return line 330_1, cooler 308_2 is coupled to facility heat exchanger 326_2 by supply line 328_2 and return line 330_2, and so on. The coolers in row 2, which is not visible in this drawing because it is behind row 1, are similarly coupled to facility heat exchangers. In one embodiment, for each cluster there can be a one-to-one correspondence of coolers to facility heat exchangers—that is, each cooler is fluidly coupled to its own facility heat exchanger. But in other embodiments there can be a many-to-one correspondence between coolers and facility heat exchangers; for instance, a cooler from row 1 and a cooler from row 2 can both be fluidly coupled to, and thus share, a single facility heat exchanger. Still other embodiments can have a one-to-many correspondence between coolers and facility heat exchangers (i.e., each cooler is fluidly coupled to multiple facility heat exchangers) or a many-to-many correspondence between coolers and facility heat exchangers (i.e., each cooler is fluidly coupled to multiple facility heat exchangers and each facility heat exchanger is fluidly coupled to multiple coolers). It can be seen that only external loop is needed for the entire facility side. Each individual external cooling unit is populated on the top of the IT cluster. This is distinguished from previous solution that the fluid running over the top of the rack are internal loops.

In one embodiment, all coolers in a row or cluster, and their corresponding facility heat exchangers, are of the same type—i.e., single-phase or multi-phase. But in other embodiments all coolers in a row or cluster, and their corresponding facility heat exchangers, need not be of the same type. In system 300, for instance, a group 332 of one or more coolers 308 and facility heat exchangers 326 can be multi-phase heat exchangers (e.g., liquid supply and vapor return, as indicated by the different line types used in the drawing for supply and return), while the remainder of heat exchangers 326 can be single-phase heat exchangers (e.g., liquid supply and liquid return, as indicated in the drawing by the same line types used for supply and return). Thus, within each cluster it is possible to have a sub-cluster that is cooled differently. Generally, the heat exchanger in each cooler (see FIG. 2) should be compatible with its corresponding facility heat exchanger: if the cooler's heat exchanger is single-phase, then so must the corresponding facility heat exchanger's, and so on. The external cooling unit can be individually configured depending the fluid requirement. This is enabled by forming the internal loop within the cluster. In such a design, different types of external cooling fluid can be used for different portions of a cluster, and the corresponding infrastructure to enable such implementation is simplified by the internal loop design described here. Again, the internal loop is formed by the IT enclosure and cooling unit and within multiple combined IT enclosure and cooling unit. Each cooling unit is used for serving the IT container connected to it and extracts heat to the external loop connected to it. Therefore, the individual cooling unit control is critical to maintain the internal loop both recirculating as well as operating conditions.

Figure 4A:
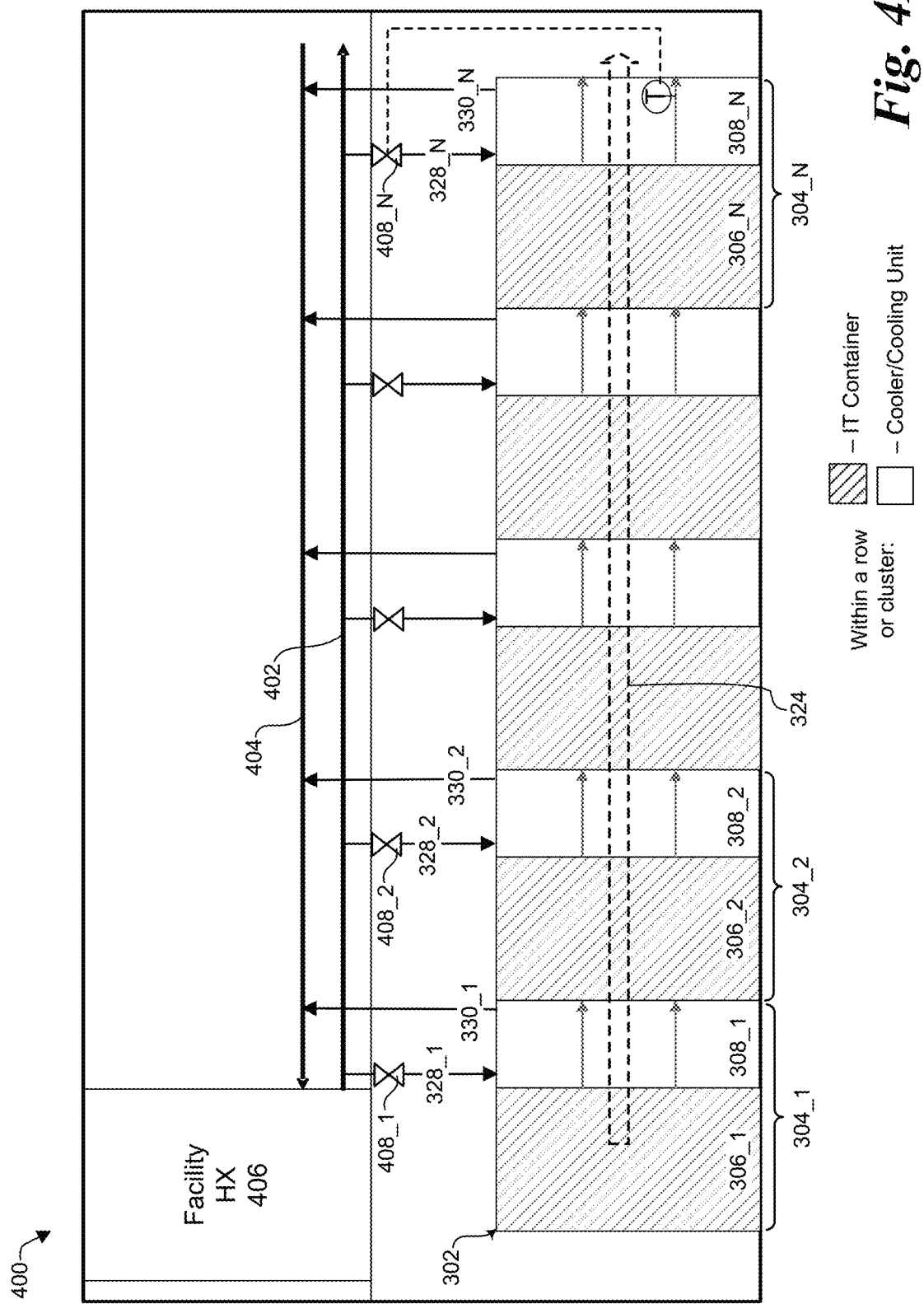
FIGS. 4A-4C are side-view drawings of embodiments of modularized cooling systems.
Figure 4B:
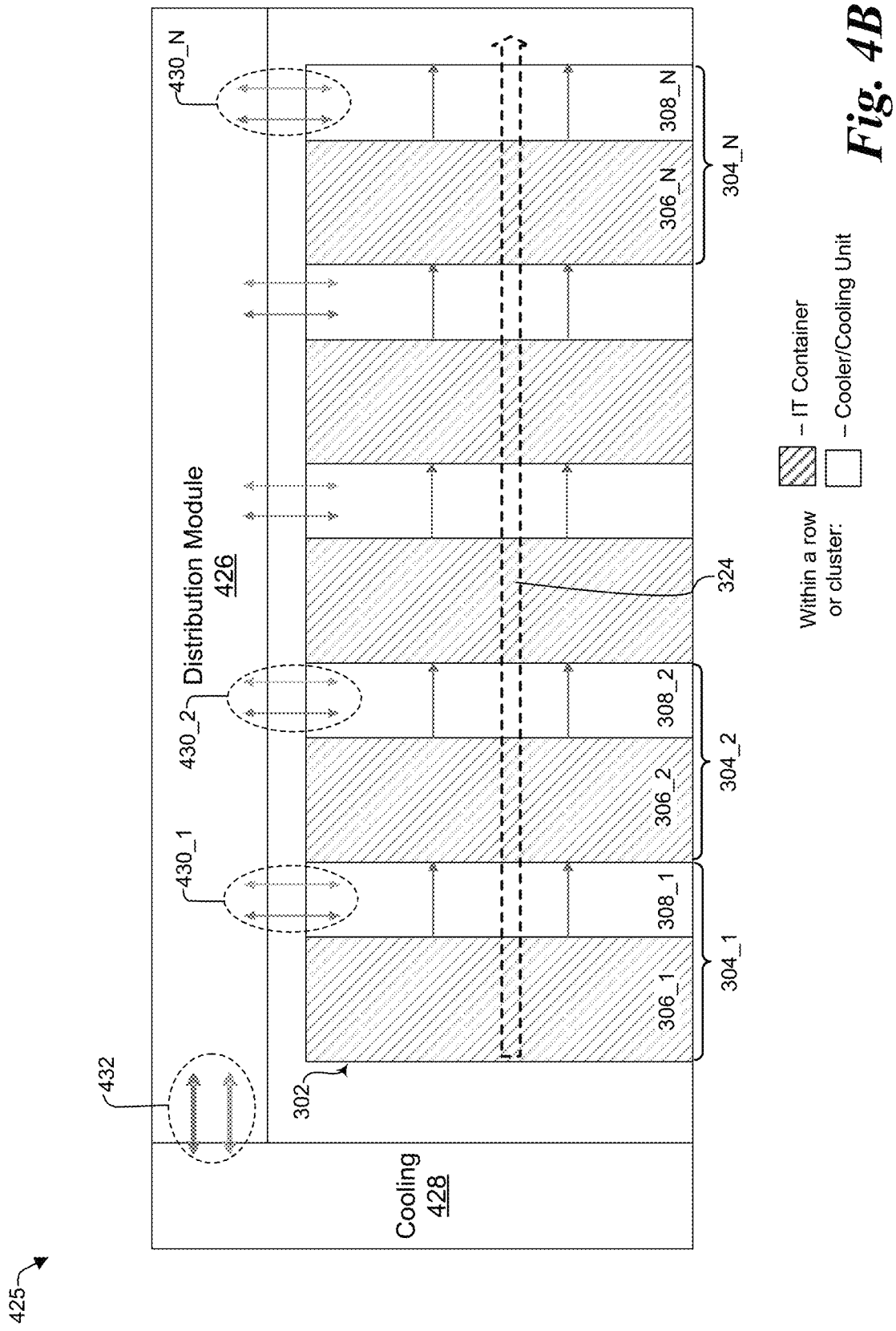
Figure 4C:
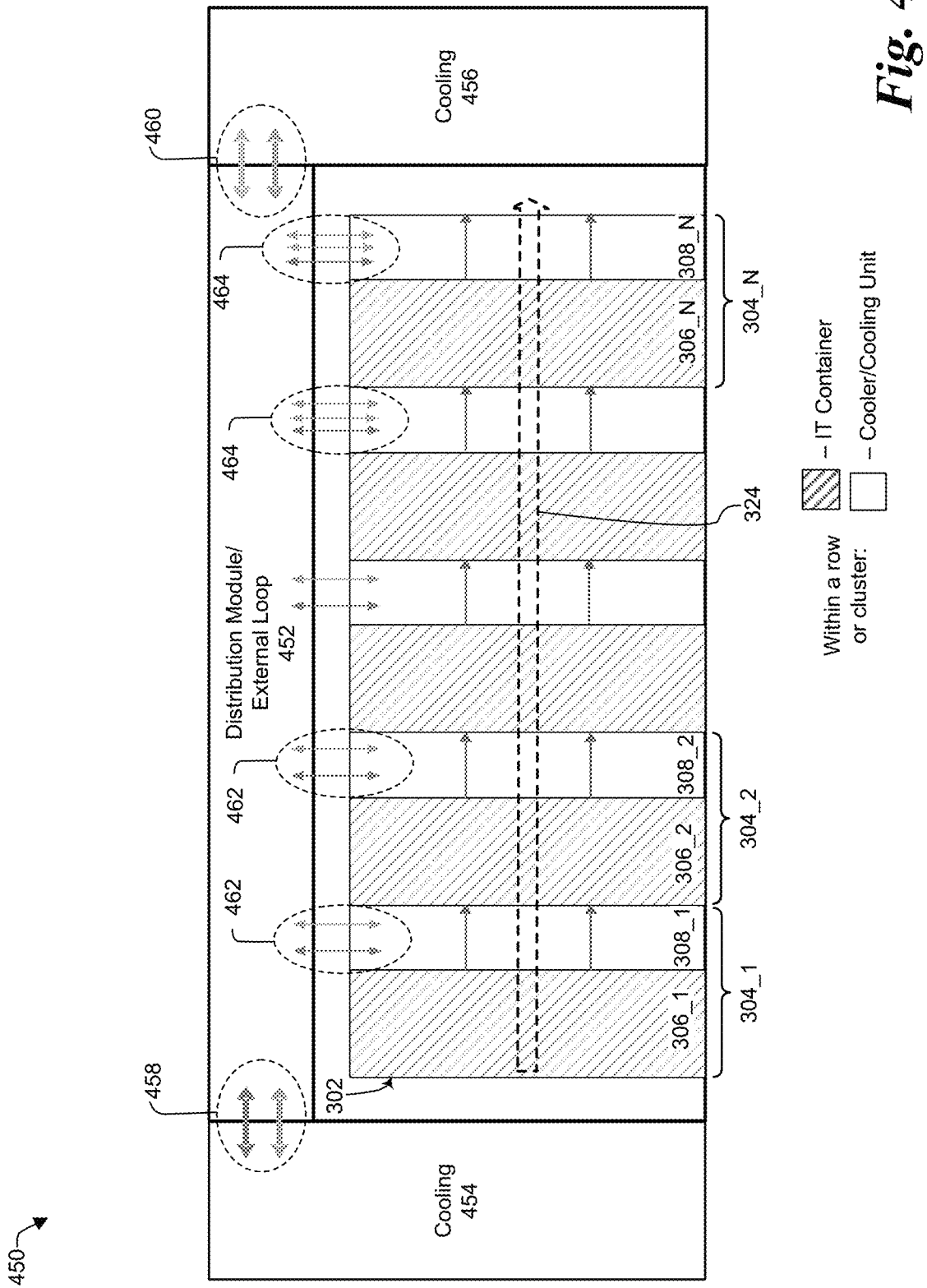

FIGS. 4A-4C illustrate other embodiments of cooling systems. FIG. 4A illustrates an embodiment of a system 400 in which the external cooling loop coupled to the coolers in the cluster is a shared central distribution loop. In system 400, each cooler 308 in row 1 of a cluster such as cluster 302 is fluidly coupled to a facility cooling system. As in system 300, in system 400 each cooler 308 has a supply line 328 and a return line 330, but in system 400 each supply line also includes a control valve 408 to control the flow between the facility lines and the cooler. The supply temperature of each cooling unit is used for controlling the valve on the external loop (e.g., valve 408), with the valve open ratio controlling the flow rate of the external loop. This is the cooling fluid of the heat exchanger within the cooling unit. Each cooler has a heat exchanger to exchange heat between the internal loop and external loop (see FIG. 2); this control design ensures that the temperature supplied by the cooling unit stays the same by controlling the cooling fluid delivered to the cooling unit.

For each cooler 308, its supply line 328 is fluidly coupled, via its control valve 408, to a facility supply line 402. Each return line 330 is fluidly coupled a facility return line 404. Facility supply line 402 and facility return line 404 are in turn fluidly coupled to a facility heat exchanger 406. The coolers in row 2, which is not visible in this drawing because it is behind row 1, can be similarly coupled to facility supply and return lines. In one embodiment the coolers in row 2 are fluidly coupled to the same facility supply and return lines as the coolers in row 1, but in other embodiments the coolers in row 2 can be fluidly coupled to facility supply and return lines different than the ones to which the coolers in row 1 are coupled. In another embodiment, facility supply line 402 402 and facility return line 404 can be integrated into cluster 302, so that the fluid connections 328 and 330 all exist within the cluster and the cluster need only be coupled to facility heat exchanger 406, thus requiring only one facility connection.

FIG. 4B illustrates another embodiment of a cooling system 425. Cooling system 425 shows how a cooling system can be partitioned, modularized, and integrated. As in systems 300 and 400, coolers within a cluster 302 are fluidly coupled to a distribution module 426 by supply and return lines. Distribution module 426 is in turned coupled to a facility cooling unit 428. With this modularization, system integration requires only two facility-level connections for the entire system to be ready for operation: one connection 432 between each facility cooling unit 428 and distribution module 426, and a set of connections 430 between distribution module 426 and individual coolers in each cluster. As a result of this arrangement, the module also includes either partial internal loop and full external loop, or full internal loop and partial external loop. The internal loop can be dynamic adjusted with limited impact on either IT or the external loop.

FIG. 4C illustrates another embodiment of a cooling system 450. Cooling system 450 shows how a cooling system can be partitioned and modularized. As in systems 400 and 425, coolers 308 within a cluster 302 are fluidly coupled to a distribution module 452 by supply and return lines. Distribution module 452 is in turned coupled to a pair of facility cooling units 454 and 456. With this modularization, system integration requires only four facility-level connections. The first two connections are a connection 458 between facility cooling unit 454 and distribution module 426 and a connection 460 between facility cooling unit 456 and distribution module 452. The next connection is a set of connections 462 between distribution module 452 and coolers 308 that use cooling unit 454, and the final connection is a set of connections 464 between distribution module 452 and the coolers that can use one or both of cooling unit 454 and cooling unit 456. In one embodiment, cooling units 454 and 456 use different cooling fluids, but in other embodiments they can use the same cooling fluid. In still other embodiments, cooling units 454 and 456 can use different phases of cooling fluids; for instance, cooling unit 454 can be a liquid-phase cooling unit while cooling unit 456 can be a vapor-phase cooling unit (e.g., a condenser). As a result of this arrangement, the module also includes either partial internal loop and full external loop, or full internal loop and partial external loop. The internal loop can be dynamic adjusted with limited impact on either IT or the external loop. It can be seen the design enable a very compact architecture for implementing multiple heat transfer loops in a data center eliminating any facility side dependence, at the same time, enable modularity design.

For system 400, 425, and 450, the operation of the flow rate within the internal loop are kept as the same by adjusting the individual pump 212 within each cooler (see FIG. 2). One efficient method involves adjusting the pump to a same constant speed within each cluster. The supply temperature is controlled using the flowchart shown in FIG. 8 to ensure proper fluid temperature maintenance within the internal loop and that fluid is delivered to each IT enclosure based on the design and operation requirement.

Figure 5A:
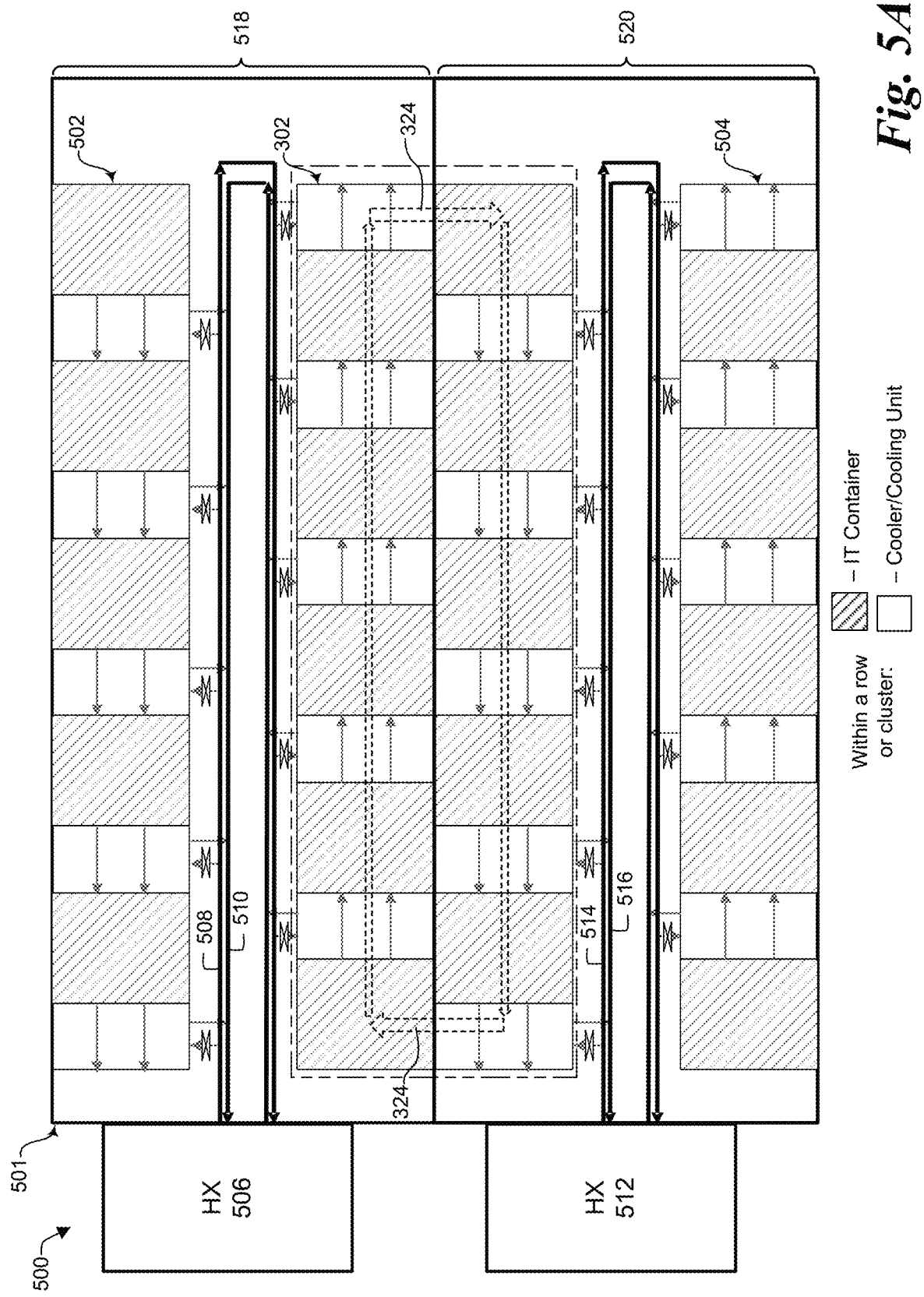
FIGS. 5A-5B are plan-view drawings of embodiments of cooling systems.
Figure 5B:
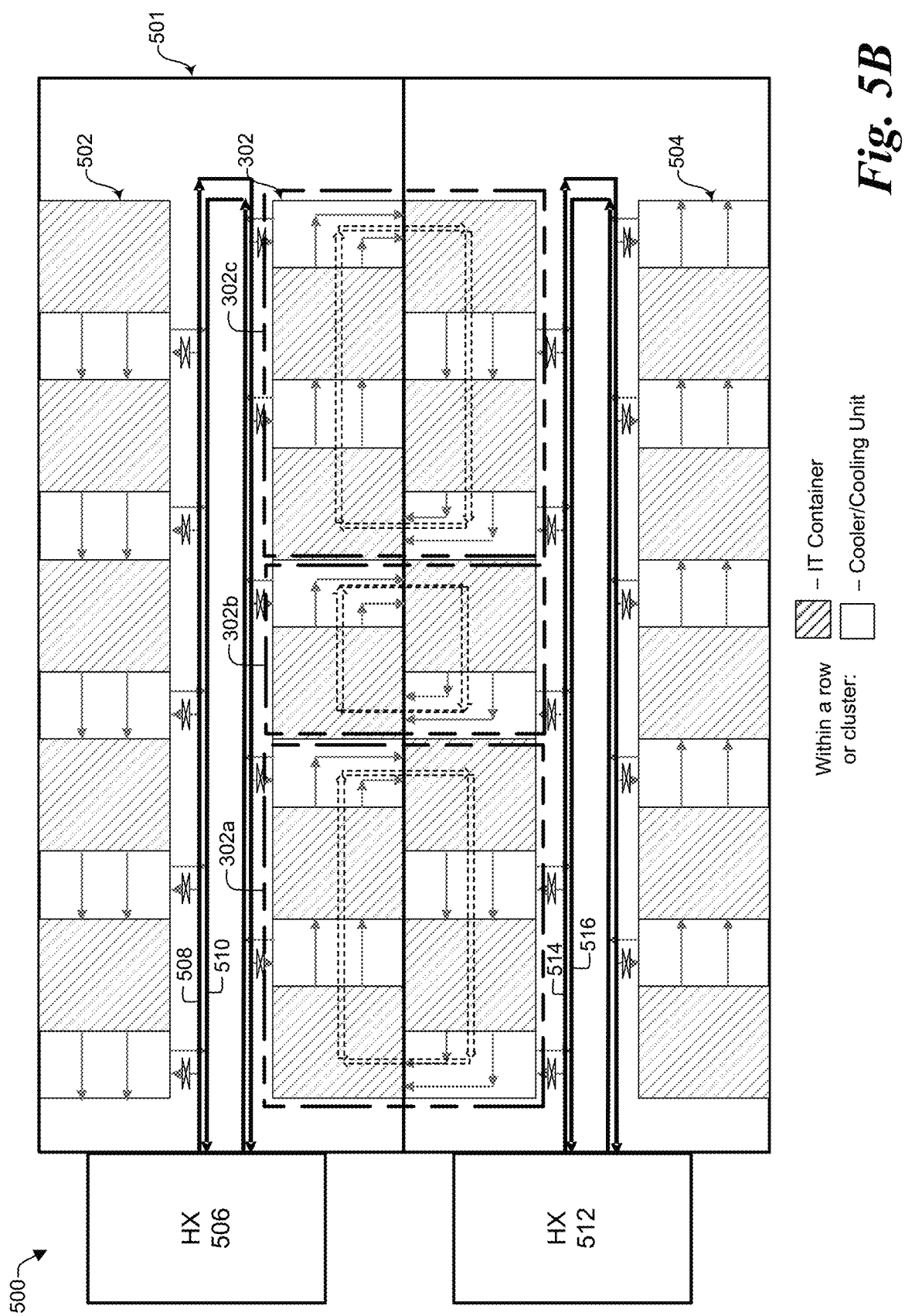

FIGS. 5A-5B illustrate another embodiment of a cooling system 500. Cooling system 500 includes a facility 501 within which at least one cluster 302 is positioned between rows 502 and 504 of IT units. In one embodiment rows 502 and 504 can be standalone rows of IT units, but in other embodiment they can be part of a cluster whose other half is not shown in the drawing (but see, e.g., FIG. 6); for instance, in one embodiment row 502 can be the first row of a second cluster similar to cluster 302, while row 504 can be the second row of a third cluster similar to cluster 302. The IT units in cluster 302 and rows 502 and 504 can be as described above in FIG. 2, so that each IT unit includes an IT container and a cooler. Cluster 302 includes one pair of inter-row fluid connections, so that a single recirculation loop 324 is formed within the cluster.

Cooling system 500 includes a pair of cooling units (e.g., heat exchangers (HX)) 506 and 512 positioned outside facility 501 to transfer heat from the cooling fluid circulating through cluster 302 and rows 502 and 504 to the atmosphere. Heat exchanger 506 is fluidly coupled to a supply loop 508 and a return loop 510. Supply loop 508 and return loop 510 are positioned between row 502 and one row of cluster 302; supply loop 508 is fluidly coupled by control valves to one or more coolers in row 502 and one or more coolers in the one row of cluster 302, and return loop is fluidly coupled to one or more coolers in row 502 and one or more coolers in the one row of cluster 302. Similarly, heat exchanger 512 is fluidly coupled to a supply loop 514 and a return loop 516. Supply loop 514 and return loop 516 are positioned between row 504 and the other row of cluster 302; supply loop 514 is fluidly coupled by control valves to one or more coolers in row 504 and one or more coolers in the other row of cluster 302, and return loop 516 is fluidly coupled to one or more coolers in row 504 and one or more coolers in the other row of cluster 302. It can be seen that the cluster 302 is formed by two IT rows, as circled by the dashed line. The external loop and the service region is arranged on the other side of the row. In this embodiment the cooling capacity provided by the two cooling units can be distributed by the two external recirculation loops. Cluster 302 receives two different external sources of cooling fluid which may benefit in the scenarios such as cooling unit or external loop failures. In the illustrated embodiment, system 500 can be thought of as being divided into two modules. A first module 518 includes heat exchanger 506, supply line 508 and return line 510, row 502, and the upper row of cluster 302. A second module 520 includes heat exchanger 512, supply line 514 and return line 516, row 504, and the lower row of cluster 302. In the illustrated embodiment modules 518 and 520 are substantially identical.

FIG. 5B illustrates system 500 of FIG. 5A with cluster 302 in a different configuration. In FIG. 5A, cluster 302 includes one pair of inter-row fluid connections, so that a single recirculation loop 324 is formed within the cluster. But the number of pairs of inter-row fluid connections within cluster 302 can be changed to form multiple sub-clusters, each with its own recirculation loop. In the configuration of FIG. 5B, then, cluster 302 includes three pairs of inter-row fluid connections, so that three sub-clusters 302a, 302b, and 302c are formed within cluster 302. Sub-clusters 302a and 302c are formed by four IT units, and sub-cluster 302b is formed by two IT units. Other embodiments can, of course, divided cluster 302 into a different number of sub-clusters than shown, using a different number of pairs of inter-row connections. The coolers in each row of cluster 302 are connected to their respective facility supply and return loops as described above, but with the new configuration of inter-row fluid connections within the cluster, fluids flows in, out, and within each sub-cluster separately from the other sub-clusters. It can be seen that by using the method proposed by the current invention can form different types of internal loop based on need. The three clusters maybe appointed to different customers or different software applications. System 500 thus not only eliminates the internal loop facility design, but also allows different types of internal loop configuration and management among IT clusters. Again, the three clusters are shown as examples, arrange for three different types of IT container/hardware, different types of workload and services, different service level arrangement, different external cooling loops, different customers and so on.

Figure 6A:
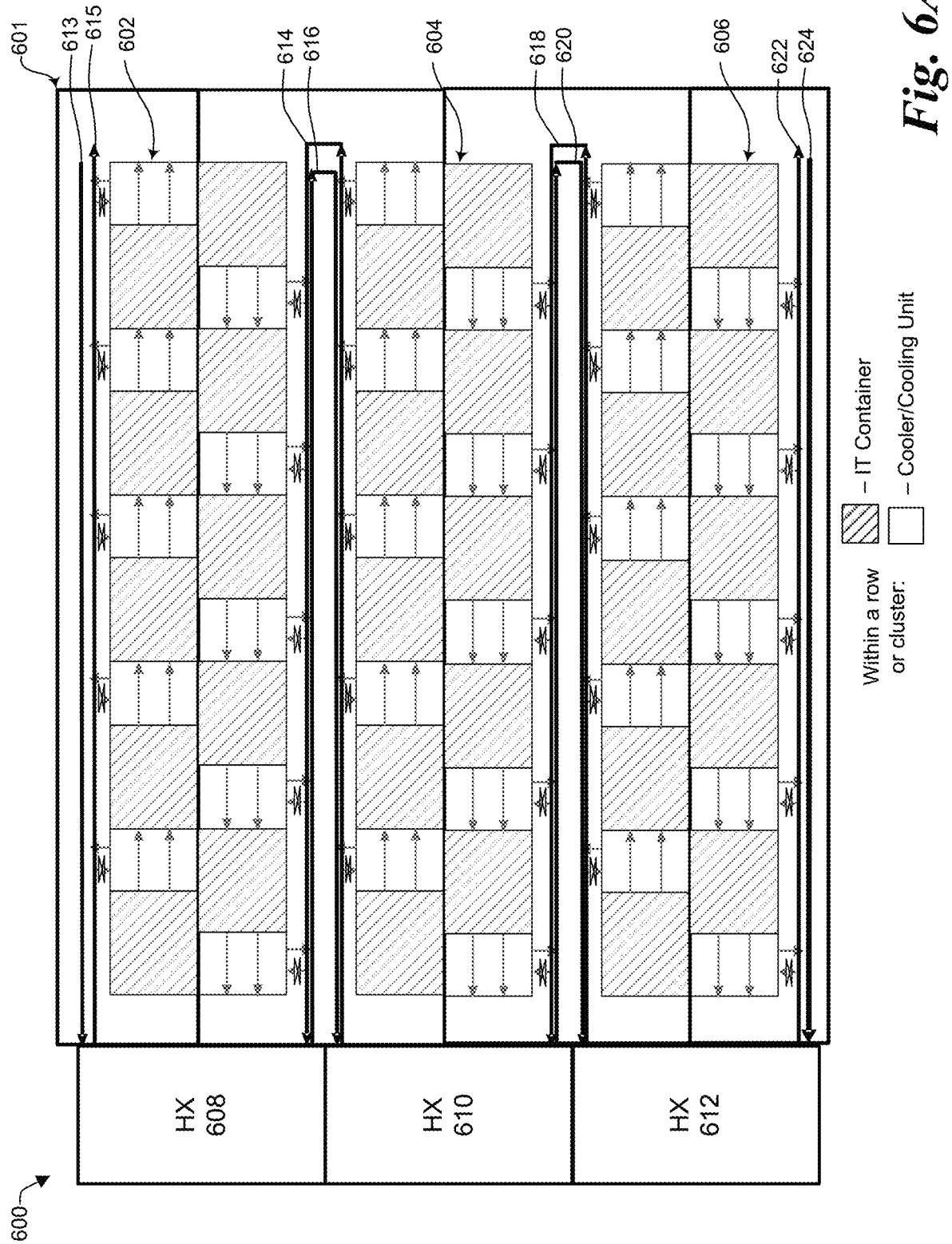
FIGS. 6A-6C are plan-view drawings of an embodiment of a cooling system and module configurations that can be formed within it.

FIG. 6A illustrates another embodiment of a cooling system 600. Cooling system 600 includes a facility 601 within which are positioned three IT clusters: first cluster 602, second cluster 604, and third cluster 606. In one embodiment clusters 602, 604, and 606 are configured similarly to cluster 302, with IT units configured with alternating IT containers and coolers. Each of clusters 602, 604, and 606 can have one or more internal recirculation loops, as shown in FIGS. 3A-3B and 5B.

Cooling system 600 includes three cooling units (e.g., heat exchangers (HX)) 608, 610, and 612 positioned outside facility 601 to transfer heat from the cooling fluid circulating through clusters 602, 604, and 606 to the atmosphere. Each heat exchanger is coupled to a facility supply loop and a facility return loop to provide cool fluid to the clusters and receive hot fluid returned from the clusters. In the illustrated embodiment, each heat exchanger pair provides facility supply and return lines to a pair of clusters. Facility supply line 614 is fluidly coupled to heat exchangers 608 and 610 to supply cooling fluid to clusters 602 and 604, and facility return line 616 is coupled heat exchangers 610 and 608 to return fluid from clusters 604 and 602. Similarly, facility supply line 618 is fluidly coupled to heat exchangers 610 and 612 to supply cooling fluid to clusters 604 and 606, and facility return line 620 is fluidly coupled to heat exchangers 612 and 610 to return fluid from clusters 604 and 606. Facility supply line 615 and return line 613 are similarly fluidly coupled to heat exchangers to supply fluid to and return fluid from cluster 602 and an additional cluster (not shown) above cluster 602, and facility supply line 622 and return line 624 are fluidly coupled to heat exchangers to supply fluid to and return fluid from cluster 606 and an additional cluster (not shown) below cluster 602. Each cooler is fluidly coupled to its respective supply line by control valves.

Figure 6B:
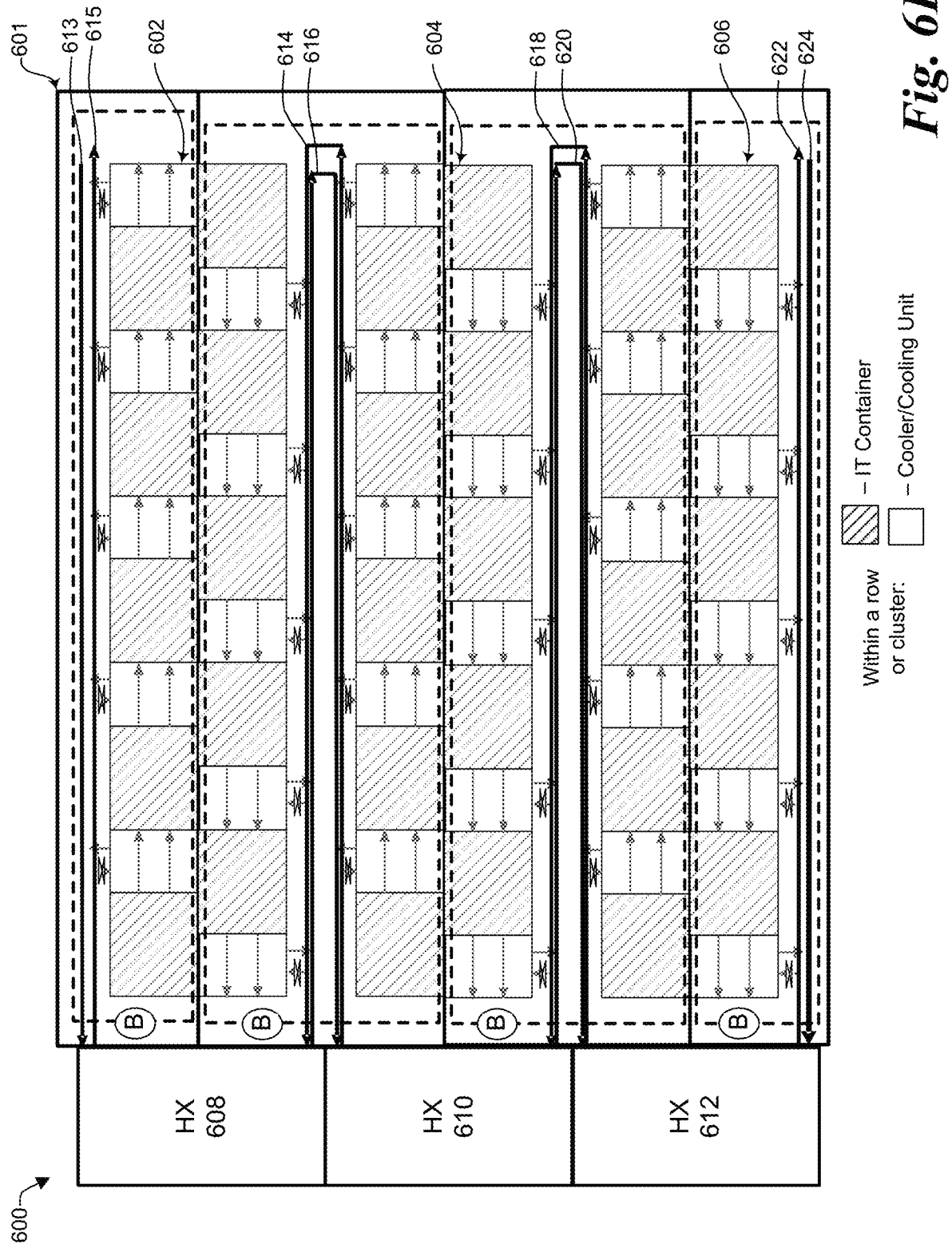
Figure 6C:
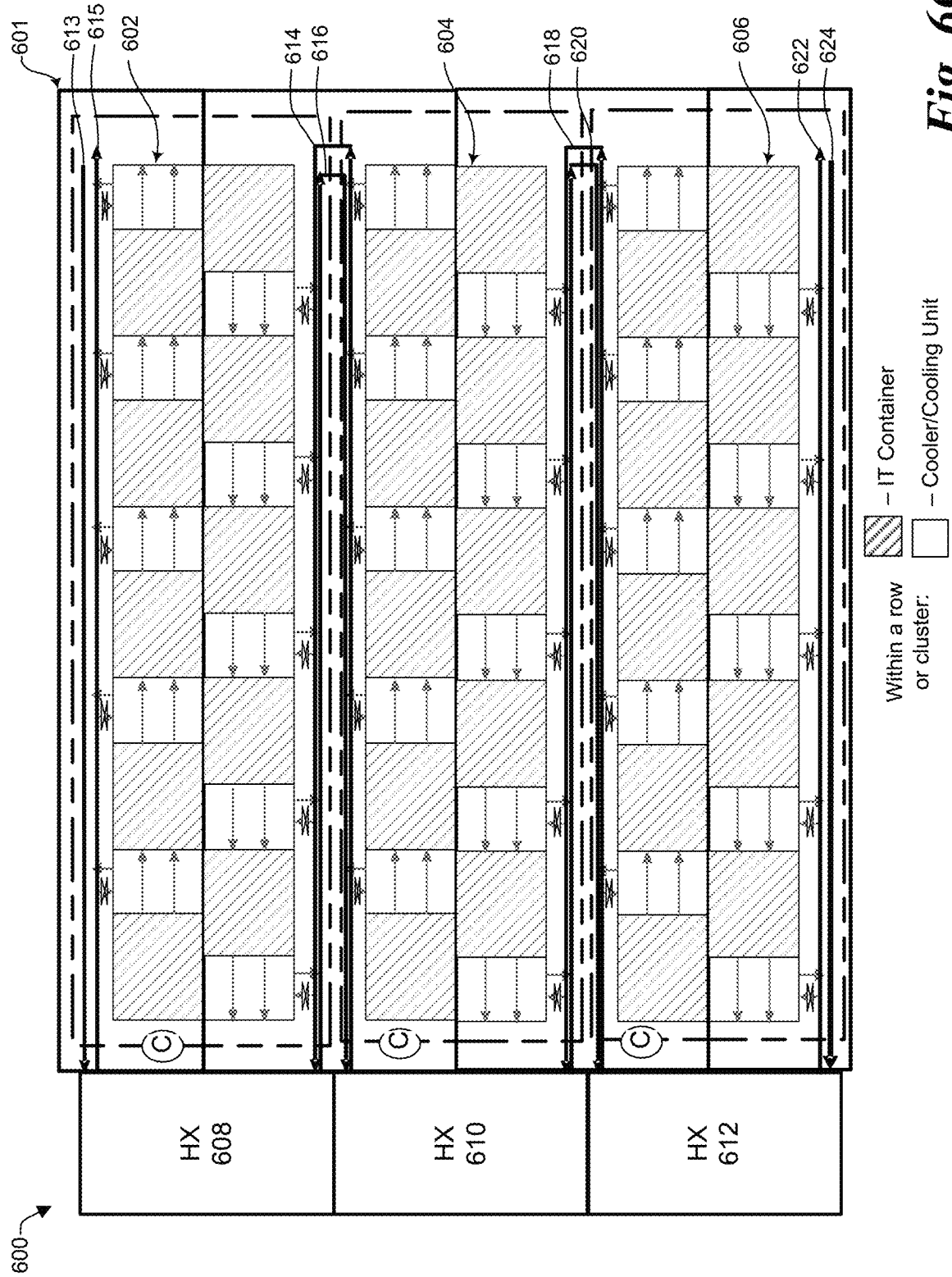

FIGS. 6B-6D illustrate different cooling module configurations that can be implemented with system 600, making this system highly compatible with modular data center/IT cluster concept. The particular module design depends only on how the system can be prefabricated and deployed, and actual system configuration can be adjusted after deployment.

FIG. 6B illustrates a first module configuration of system 600 with a complete external loop and a partial and separate internal loop. In this configuration, the system is divided into four modules B. In each module B, the external loop (i.e., the facility loop that is external to the cluster) is formed completely within the module and the internal loop (i.e., the cluster's internal recirculation loop) is partially formed by one row from each cluster within the module. In this design, each module B contains a complete external loop. Two different methods may be fit for different use cases, and this design provides the system partition method for designing it into modules. In this embodiment, the external cooling loop is completed before the module deployment, and it may require cooling module connected to it. In this case, cooling unit is a separate module.

FIG. 6C illustrates a third module configuration of system 600 with a complete internal loop and a separate external loop. In this configuration, the system is divided into three modules C. Each module C includes a complete cluster and its external loops. At least one complete internal recirculation loop is formed within each cluster, and the external cooling loop (i.e., the facility cooling loop) is separate. The external cooling loops are formed after the cluster is populated with IT units, and the internal loop is pre-formed in the cluster based on design requirements.

Figure 7:
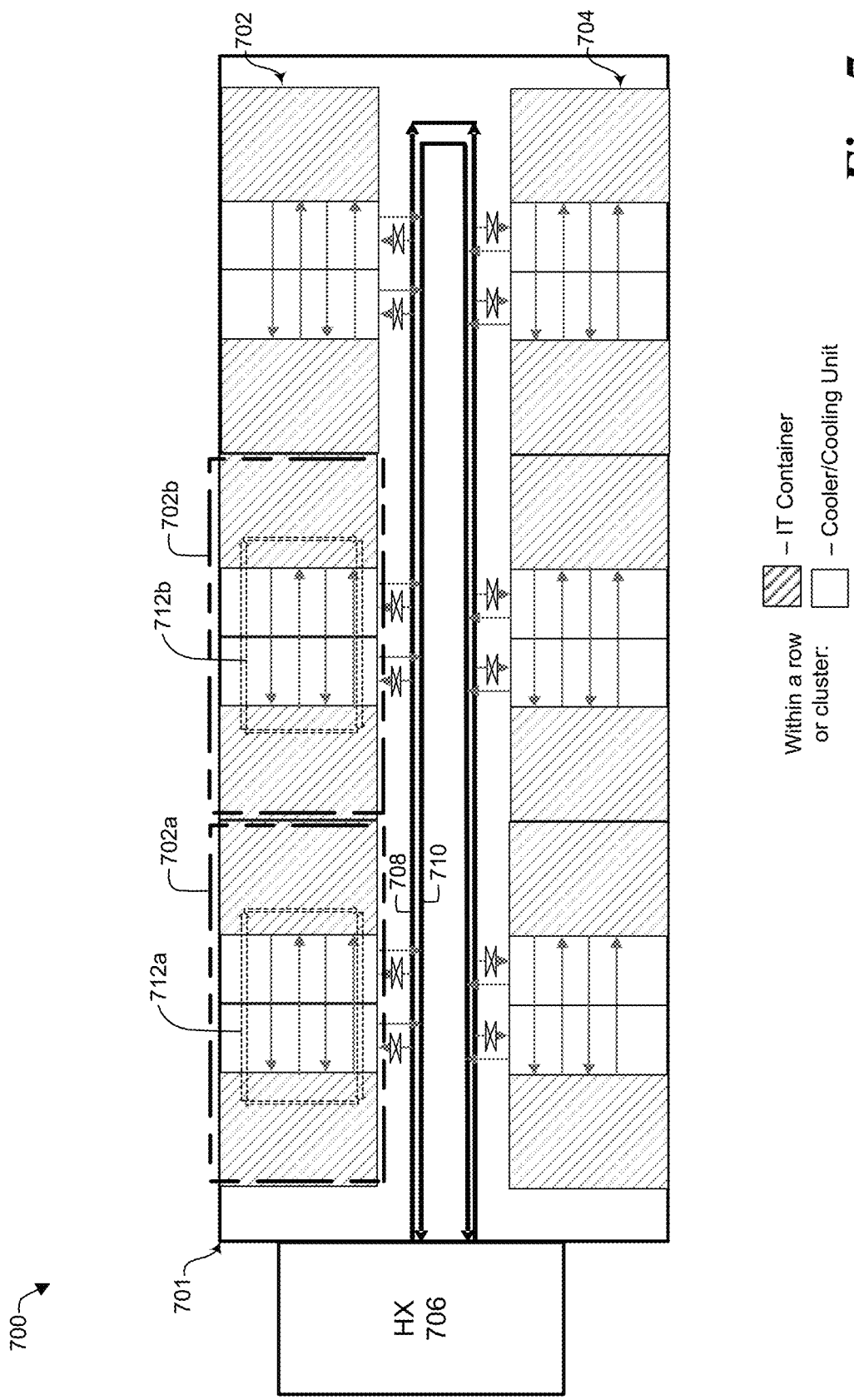
FIG. 7 is a plan-view drawing of an embodiment of a cooling system.

FIG. 7 illustrates another embodiment of a cooling system 700. Cooling system 700 includes a facility 701 within which are positioned two rows 702 and 704 of IT units. In one embodiment rows 702 and 704 can be standalone rows of IT units, but in other embodiment one or both can be part of a cluster whose other half is not shown in the drawing (but see, e.g., FIG. 6). For instance, in one embodiment row 702 can be the first row of a cluster similar to cluster 302, while row 704 can be the second row of another cluster similar to cluster 302. The IT units in rows 702 and 704 can be as described above in FIG. 2, so that each IT unit includes an IT container and a cooler.

Cooling system 700 includes a facility heat exchanger (HX) 706 positioned outside facility 701 to transfer heat from the cooling fluid circulating through rows 702 and 704 to the atmosphere. Heat exchanger 706 is fluidly coupled to a supply loop 708 and a return loop 710. Supply loop 708 and return loop 710 are positioned between rows 702 and 704. Supply loop 708 is fluidly coupled by control valves to one or more coolers in rows 702 and 704, and return loop 710 is fluidly coupled to one or more coolers in rows 702 and 704.

A primary difference between cooling system 700 and other systems described above is the order of the IT containers and coolers within the row. In previous embodiments, IT containers and coolers alternated in each row, so that no IT container was adjacent to another IT container and no cooler was adjacent to another cooler. In other words, from the upstream end of the row to the downstream end of a row, the order of IT containers and coolers in the row was:

Container→Cooler→Container→Cooler→etc.

By contrast, in cooling system 700 the order of IT containers and coolers in rows 702 and 704 is:

Container→Cooler→Cooler→Container→Container-→Cooler→etc.

Orienting the IT units this way puts every cooler adjacent to another cooler and every IT container adjacent to another IT container. Or, put differently, every IT container is adjacent to a cooler and another IT container, and every cooler is adjacent to an IT container and another cooler. By orienting the IT units this way in a row and coupling the outlet of each cooler to the inlet of each cooler which it abuts, each pair of IT units can form a sub-cluster with its own recirculation loop. In row 702, then, arranging the IT units and connecting their coolers this way results in sub-cluster 702a having its own recirculation loop 712a and sub-cluster 702b having its own recirculation loop 712b. Although only sub-clusters 702a and 702b are illustrated in the figure, in some embodiments every pair of IT units can be used to form a sub-cluster. This provides very high flexibility for configuring the system and managing the cooling fluid loop.

Figure 8:
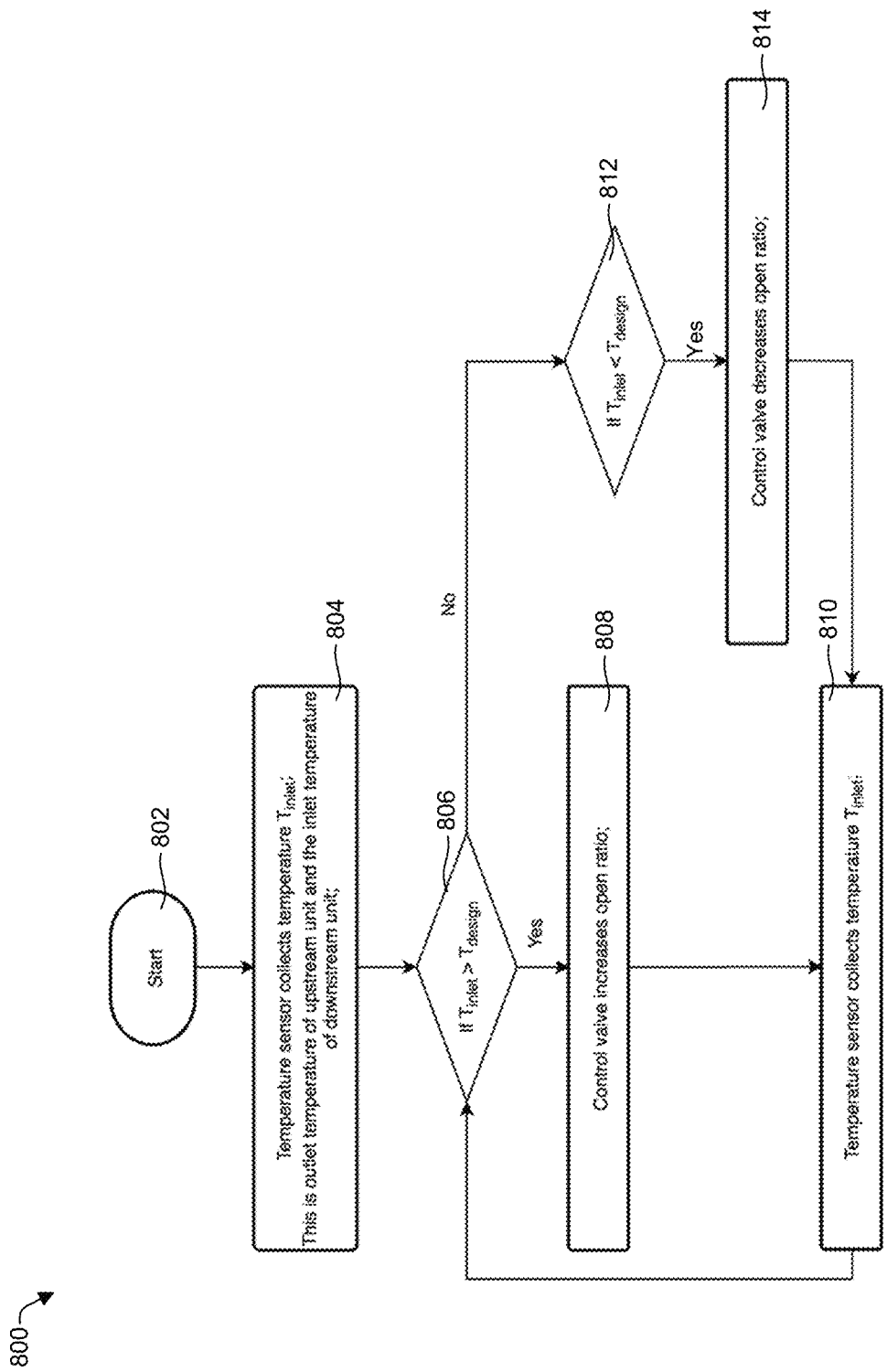
FIG. 8 is a flowchart of an embodiment of a process for controlling the flow of cooling fluid between an interior recirculation loop and an external loop.

FIG. 8 illustrates an embodiment of a process 800 for controlling the interaction between a cooler such as the one shown in FIG. 2 and a facility cooling system, for instance as shown in FIG. 4A. The process begins at block 802. At block 804, the process collects temperature Tinlet, which is the outlet temperature of the upstream cooling unit and the inlet temperature of a downstream unit—e.g., the temperature sensor T in each cooler—(see FIG. 2).

At block 806 the process determines whether Tinlet exceeds the design temperature. If at block 806 Tinlet exceeds the design temperature, then the process moves to block 808 where the process attempts to decrease Tinlet by increasing the open ratio of the control valve—that is, by increasing the amount of fluid the control valve 408 allows through. Having increased the open ratio of control valve 408 at block 808, the process moves to block 810, where it again collects Tinlet, and then returns to block 806 to check whether Tinlet exceeds the design temperature. But if at block 806 the process determines that Tinlet does not exceed the design temperature, the process moves to block 812 to determine whether Tinlet is less than the design temperature. If at block 812 Tinlet is less than the design temperature, the process moves to block 814, where it attempts to increase Tinlet by decreasing the open ratio of the control valve, then returns to block 810 where it again checks the value of Tinlet.

Other embodiments of cooling system arrangements are possible besides the ones described above. For instance:

The IT container or IT rack including the loop design within it can be different.

The internal layout can be configured in different ways.

The modular scheme for the entire system (internal loop, external loop, and external cooling unit) can be different than shown.

The above description of embodiments is not intended to be exhaustive or to limit the invention to the described forms. Specific embodiments of, and examples for, the invention are described herein for illustrative purposes, but various modifications are possible.

What is claimed is:

1. An apparatus comprising:
   a plurality of information technology (IT) units arranged into an IT cluster, each IT unit including an IT container paired with and fluidly coupled to a corresponding cooler adjacent to the IT container, each IT container being upstream of its corresponding cooler, the IT cluster including:
   a first row having an upstream end and a downstream end and including a plurality of IT units positioned adjacent to and abutting each other, and
   a second row having an upstream end and a downstream end, the second row being adjacent to the first row and including a plurality of IT units positioned adjacent to and abutting each other,
   wherein the cooler of each IT unit in the first row is selectively fluidly coupled by an intra-row fluid connection to the IT container of the next downstream IT unit in the first row and by an inter-row fluid connection to the IT container of one of the plurality of IT units in the second row.

2. The apparatus of claim 1, wherein:
   the cooler of each IT unit in the second row is either fluidly coupled by an intra-row fluid connection to the IT container of the next downstream IT unit in the second row or is fluidly coupled by an inter-row fluid connection to the IT container of one of the plurality of IT units in the first row, and
   the cluster includes at least one pair of inter-row fluid connections, wherein the at least one pair of inter-row fluid connections, the intra-row fluid connections in the first row, and the intra-row fluid connections in the second row, form at least one fluid loop within the IT cluster.

3. The apparatus of claim 2 wherein the first row and the second row are parallel to each other and wherein:
the upstream end of the first row is adjacent to the downstream end of the second row; and
the downstream end of the first row is adjacent to the upstream end of the second row.

4. The apparatus of claim 3 wherein the at least one pair of inter-row fluid connections include a first inter-row fluid connection that fluidly couples the upstream end of the first row to the downstream end of the second row and a second inter-row fluid connection that fluidly couples the downstream end of the first row to the upstream end of the second row, so that a single fluid loop is formed in the IT cluster.

5. The apparatus of claim 2 wherein the at least one pair of inter-row fluid connections include two or more pairs of inter-row fluid connections, wherein the two or more pairs of inter-row fluid connections, the intra-row fluid connections in the first row, and the intra-row fluid connections in the second row, form multiple fluid loops within the IT cluster.

6. The apparatus of claim 2 wherein each cooler comprises:
a cooler inlet fluidly coupled to the corresponding IT container, an open-loop outlet fluidly coupled to either an intra-row fluid connection or an inter-row fluid connection, and a closed-loop outlet;
a fluid bypass line having a first three-way valve and a second three-way valve coupled therein, wherein the fluid bypass line is fluidly coupled to the unit inlet and is fluidly coupled by the second three-way valve to the open-loop outlet and the closed-loop outlet; and
a main cooling loop fluidly coupled to the fluid bypass line.

7. The apparatus of claim 6, wherein the main cooling loop comprises:
a heat exchanger having an inlet and an outlet, the inlet of the heat exchanger being fluidly coupled by a supply line to the fluid bypass line at or near the unit inlet, and the outlet of the heat exchanger being coupled by a return line to the fluid bypass line between the first three-way valve and the second three-way valve;
a pump fluidly coupled in the return line; and
a two-way line fluidly coupled to the first three-way valve and to the return line upstream of the pump.

8. The apparatus of claim 7 wherein the heat exchanger of at least one cooler further comprises an external inlet adapted to be coupled by a control valve to a facility supply line and an external outlet adapted to be fluidly coupled to a facility return line.

9. The apparatus of claim 7 wherein the heat exchanger of at least one cooler is a multi-phase heat exchanger that further comprises an external inlet adapted to be coupled to a facility supply line and an external outlet fluidly adapted to be coupled to a facility vapor return.

10. A data center facility comprising:
one or more information technology (IT) clusters, each IT cluster including plurality of information technology (IT) units, each IT unit including an IT container paired with and fluidly coupled to a corresponding cooler adjacent to the IT container, each IT container being upstream of its corresponding cooler, and each IT cluster including:
a first row having an upstream end and a downstream end and including a plurality of IT units positioned adjacent to and abutting each other, and
a second row having an upstream end and a downstream end, the second row being adjacent to the first row and including a plurality of IT units positioned adjacent to and abutting each other,
wherein the cooler of each IT unit in the first row is selectively fluidly coupled by an intra-row fluid connection to the IT container of the next downstream IT unit in the first row and by an inter-row fluid connection to the IT container of one of the plurality of IT units in the second row; and
a data center cooling system including a facility heat exchanger coupled to at least one facility loop that includes a facility supply line and a facility return line, wherein each cooler in the one or more IT clusters is coupled to the facility supply line and the facility return line.

11. The data center facility of claim 10, wherein:
the cooler of each IT unit in the second row is either fluidly coupled by an intra-row fluid connection to the IT container of the next downstream IT unit in the second row or is fluidly coupled by an inter-row fluid connection to the IT container of one of the plurality of IT units in the first row, and
the IT cluster includes at least one pair of inter-row fluid connections, wherein the at least one pair of inter-row fluid connections, the intra-row fluid connections in the first row, and the intra-row fluid connections in the second row, form at least one fluid loop within the IT cluster.

12. The data center facility of claim 11 wherein pairs of coolers in each cluster share the data center cooling system, so that pairs of coolers including one cooler from the first row and one cooler from the second row are coupled to the facility supply line and the facility return line of the same facility loop.

13. The data center facility of claim 11 wherein the data center cooling system includes first and second data center cooling systems, wherein the first data center cooling system uses a first cooling fluid and is fluidly coupled to a subset of coolers in a cluster and the second data center cooling system uses a second cooling fluid and is coupled to a different subset of coolers in a cluster.

14. The data center facility of claim 11 wherein pairs of clusters share the data center cooling system, so that the coolers in the first row of a first cluster and the coolers in the second row of a second cluster are fluidly coupled to a single facility loop.

15. The data center facility of claim 11 wherein each cluster includes an integrated distribution module with supply and return lines adapted to be fluidly coupled to at least one facility heat exchanger.

16. The data center facility of claim 11 wherein each cooler is fluidly coupled by a supply line and a return line to a single facility heat exchanger.

17. The data center facility of claim 11 wherein the supply line of each cooler is fluidly coupled to a facility supply line by a control valve.

18. The data center facility of claim 17 wherein each cooler includes a temperature sensor to sense an outlet temperature of the cooler, and wherein the control valve is set based on the sensed outlet temperature.

19. The data center facility of claim 11 wherein at least one cluster includes two or more pairs of inter-row fluid connections, wherein the two or more pairs of inter-row fluid connections, the intra-row fluid connections in the first row, and the intra-row fluid connections in the second row, form multiple fluid loops within the IT cluster.

20. The data center facility of claim 11 wherein at least one cooler comprises:
- a cooler inlet fluidly coupled to the corresponding IT container, an open-loop outlet fluidly coupled to either an intra-row fluid connection or an inter-row fluid connection, and a closed-loop outlet;
- a fluid bypass line having a first three-way valve and a second three-way valve coupled therein, wherein the fluid bypass line is fluidly coupled to the unit inlet and is fluidly coupled by the second three-way valve to the open-loop outlet and the closed-loop outlet;
- a main cooling loop fluidly coupled to the fluid bypass line, the main cooling loop comprising:
- a heat exchanger having an inlet and an outlet, the inlet of the heat exchanger being fluidly coupled by a supply line to the fluid bypass line at or near the unit inlet, and the outlet of the heat exchanger being coupled by a return line to the fluid bypass line between the first three-way valve and the second three-way valve;
- a pump fluidly coupled in the return line; and
- a two-way line fluidly coupled to the first three-way valve and to the return line upstream of the pump.

* * * * *